United States Patent [19]

O'Mara, Jr.

[11] Patent Number: 4,839,711

[45] Date of Patent: Jun. 13, 1989

[54] DIELECTRIC FOR LASER TRIMMING

[75] Inventor: William E. O'Mara, Jr., Melbourne, Fla.

[73] Assignee: Harris Corporation, Melbourne, Fla.

[21] Appl. No.: 296,855

[22] Filed: Jan. 13, 1989

Related U.S. Application Data

[60] Continuation of Ser. No. 87,349, Aug. 20, 1987, abandoned, which is a division of Ser. No. 919,465, Oct. 16, 1986, Pat. No. 4,708,747.

[51] Int. Cl.⁴ ............... H01L 27/02; H01L 27/12
[52] U.S. Cl. ...................... 357/51; 357/237; 357/49
[58] Field of Search ............ 357/6, 237, 49, 51, 357/91

[56] References Cited

U.S. PATENT DOCUMENTS

| | | |
|---|---|---|
| 4,179,310 | 12/1979 | Compton et al. |
| 4,272,741 | 10/1979 | Johnson ........................... 357/91 |
| 4,317,686 | 3/1982 | Anand et al. ..................... 357/91 |
| 4,380,864 | 4/1983 | Das. |
| 4,387,503 | 6/1983 | Aswell et al. ..................... 357/51 |
| 4,468,414 | 8/1984 | Van Vonno. |
| 4,510,518 | 4/1985 | Van Vonno. |
| 4,549,338 | 10/1985 | Abend et al. ..................... 357/49 |
| 4,579,625 | 4/1986 | Tabata et al. ..................... 357/49 |
| 4,585,490 | 4/1986 | Raffel et al.. |
| 4,594,265 | 6/1986 | Van Vonno et al.. |
| 4,596,604 | 6/1986 | Akiyama et al. .................. 357/91 |
| 4,665,295 | 5/1987 | McDavid. |

OTHER PUBLICATIONS

Bergeron et al., IBM TDB, 24, 1982, 4656.
Fowler et al., IBM TDB, 22, 1980, 5473.

Primary Examiner—J. Carroll
Attorney, Agent, or Firm—Barnes & Thornburg

[57] ABSTRACT

The thickness of the dielectric material of an integrated circuit on top of which is provided a semiconductor layer, is selected to be an integer multiple of one-half the wavelength of the laser light in the dielectric material in order to make the dielectric material layer invisible to the laser-trimming light.

4 Claims, 1 Drawing Sheet

DIELECTRIC FOR LASER TRIMMING

This is a continuation of application Ser. No. 087,349 filed Aug. 20, 1987, abandoned, which is a divisional of application Ser. No. 919,465 filed Oct. 16, 1986, now U.S. Pat. No. 4,708,747.

BACKGROUND AND SUMMARY OF THE INVENTION

The present invention relates generally to laser-trimming and more specifically to laser-trimming above a semiconductor material layer which is on a dielectric material layer.

Laser-trimming of thin-film resistors is used extensively to produce improved accuracy in analog integrated circuit technology. In integrating laser trimming into dielectrically isolated circuit technology, a difficulty peculiar to dielectric isolation has been identified. Trimming is generally accomplished by use of an infrared laser for improved control. Silicon is nearly transparent at the wavelengths used; this results in laser energy penetrating to the bottom of the dielectrically isolated island, reflecting back and transferring some of the reflected energy back to the resistor. The result is poor control due to interference effects. These effects are variable due to changes in dielectrically isolated island-depth and proper control over trim-energy hence becomes very difficult.

An existing technique addresses the problem by simply placing the thin-film resistor over the polycrystalline silicon used to support the dielectrically isolation regions. The polysilicon is much thicker than the single-crystal islands (typically 10 mils vs. 1 mil) and energy scattering off the grain boundaries soon dissipates the laser beam. The resulting lack of reflection and interference produces enhanced controllability. The resistor is deposited over a polycrystalline surface which is not perfectly flat but in fact possesses considerable relief at the grain boundaries. In addition, large polycrystalline areas tend to "dish out" during the grind and polish operation which complicates laser-focusing and reduces photoresist definition, resulting in poor control over resistor geometries.

One solution is suggested in U.S. Pats. Nos. 4,468,414 and 4,510,518 to N. W. Van Vonno. An opening is provided in the dielectric isolation at the bottom of the single crystal island exposing the polycrystalline support. Thus, infrared radiation passes into the support and does not reflect back to the top surface of the single crystal island.

In some applications, all islands must be dielectrically isolated, and thus the solution of the aforementioned Van Vonno patent cannot be used. In such applications, Van Vonno, et al in U.S. Pat. No. 4,594,265, roughens the surface at the bottom of the single crystalline island such that the surface of the dielectric isolation is substantially non-reflective.

Both of these methods provide solutions to the reflected back energy but require additional processing steps to achieve the results.

Although this technology has been generally directed to dielectrically isolated islands, other semiconductors with insulator interfaces are also being used. For example, silicon-on-insulator (SOI) are becoming very popular in design. They would experience the same problem of laser trimming since the silicon would be transparent to the laser with the supporting insulator structure forming a reflective surface.

Thus it is an object of the present invention to provide a method of fabricating laser trimmed material over semiconductor regions which are backed by an insulative layer which has reduced reflectivity.

A still further object of the present invention is to provide a method of laser trimming material on dielectrically isolated integrated circuit regions without additional processing steps.

An even further object of the present invention is to provide an integrated circuit on which laser trimmable material is to be applied and trimmed which includes a semiconductor region backed by a dielectric layer.

These and other objects are attained by selecting the thickness of the dielectric layer to be approximately an integer multiple of one-half of the wavelength of the laser light in the dielectric layer. By defining the relationship between the laser light in the dielectric isolation layer and its thickness, the dielectric isolation layer becomes invisible to the light and does not produce the undesirable reflection. The wavelength of the laser light in the isolation layer is equal to the wavelength of the laser light divided by the refractive index of the insulated layer. Thickness may be in the range of an integer multiple of one-half of the wavelength of the laser light in the isolation plus or minus one-eighth of the wavelength of the laser light in the dielectric isolation. The dielectric isolation may be in an integrated circuit having semiconductor islands in dielectric tubs or may be a layer of silicon on a layer of dielectric isolation.

Other objects, advantages and novel features of the present invention will become apparent from the following detailed description of the invention when considered in conjunction with the accompanying drawings.

DETAILED DESCRIPTION OF THE DRAWINGS

Figure 1:
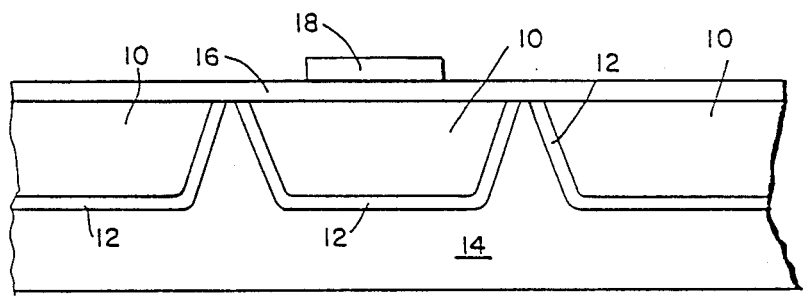
FIG. 1 is a cross-sectional view of an integrated circuit having dielectrically isolated semiconductor islands according to the principle in the current invention.

As discussed in the aforementioned patents, which are incorporated herein by reference, the problem with laser-trimming is the reflection off the dielectrically isolated integrated circuits. The thickness of the silicon layer and the dielectric isolated layer determines the phase shift of the laser light as it propagates through the silicon layer above the dielectric isolation after reflection from the bottom of the dielectrically isolated island. If the dielectric isolation were removed or made invisible to the laser light, there would be no reflection from the dielectric isolation and thus no unpredictable interference pattern in the thin film laser-trimmable material.

One solution to this problem would be to optically tune the dielectric isolation and the semiconductor layer to each other. Since the method for forming the semiconductor material in the dielectrically isolated islands includes grinding the semiconductor material to produce the dielectrically isolated regions, the exact thickness of the semiconductor material cannot be controlled sufficiently to assure optical tuning.

Another alternative is to select the thickness of the dielectric isolation so as to be optically invisible to the laser light. It has been found that by selecting the thickness of the dielectric isolation to be an integer multiple of one-half of the wavelength of the laser light in the dielectric isolation, it will not reflect the laser light. It should be noted that the laser light in the dielectric isolation is equal to the wavelength of the laser light divided by the refractive index of the dielectric isolation material. It has been found that the thickness of the dielectric isolation can be in the range of an integer multiple of half the wavelength of the laser light in the dielectric isolation plus or minus one-eighth the wavelength of the laser light in the dielectric isolation.

The properties of the optically tuned dielectric isolation, which will be shown as half-wavelength slab, are best understood using a transmission light analogy for the optical interaction in the integrated circuit. Using a standard impedance transformation formula:

$$Z_1 = \frac{Z_2 \cos(B_1 T_1) + jN_1 \sin(B_1 T_1)}{N_1 \cos(B_1 T_1) + jZ_2 \sin(B_1 T_1)} * N_1 \quad \text{(Equation 1)}$$

where:
$Z_x$ = Impedance of layer x
$N_1$ = Intrinsic Impedance of layer 1
$B_1$ = Phase Shift factor in material 1
$T_1$ = Thickness of layer 1

If the product $$B_1 T_1 = N \times \pi, \ N = \text{an integer} \quad \text{(Equation 2)}$$

then Equation 1 reduces to:

$$Z_1 = Z_2$$

Thus if $Z_1$ is the dielectric isolation and $Z_2$ is the semiconductor material and they are equal, the dielectric material will be as invisible to the laser light as is the semiconductor material. Under the conditions of Equation 1, the phase shift factor in the dielectric isolation material 1 is defined as $$B_1 = 2 \times \pi/\lambda, \quad \text{(Equation 3)}$$

where: $\lambda$ = the wavelength of light in layer 1 and is equal to the wavelength of the laser light divided by the refractive index of layer 1.

Equation 2 can be rearranged to show that layer 1 is optically invisible if:

$$T_1 = N \times \lambda/2 \quad \text{(Equation 4)}$$

With respect to the wavelength of the laser light, Equation 4 becomes:

$$\lambda_L = \frac{2 T_1 n_1}{N}$$

where
$\lambda_L$ = wavelength of laser light
$n_1$ = refractive index of layer 1

FIG. 1 illustrates semiconductor materials 10 in dielectrically isolated islands. A dielectric isolated region 12 separates the semiconductor islands 10 from each other and the support 14. An insulative layer 16 is provided across the top surface of the semiconductor regions 10 and a laser trimble material 18 rest on the insulative layer 16 above a semiconductor island 10. Semiconductor material 10 may be single crystalline silicon, the dielectric isolation region 12 silicon dioxide and the support 14 polycrystalline silicon.

Using a Neodynium YAG laser with a wavelength of 1.064 microns, the wavelength of the light in the silicon dioxide would be 1.064 divided by 1.45 or equal to 0.7338 microns. Using Equation 4 and a multiple of 6, the thickness of the dielectric layer 12 is selected to be approximately 2.2 microns. The thickness or depth of the semiconductor region 10 is in the range of 15 to 23 microns. With the selection of the dielectric isolation thickness to make it invisible to the laser light, the polycrystalline support layer 14 must either be thick enough to absorb the incoming light or have an anti-reflective backing.

Figure 2:
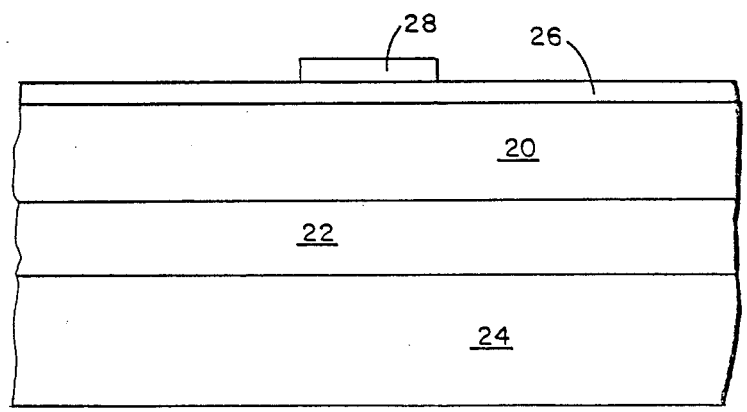
FIG. 2 is a cross-sectional view of a semiconductor on insulator according to the principles in the present invention.

There has been a substantial increase in interest development of silicon on insulator substrates. The principle of the present invention is equally applicable to laser-trimming on such an integrated circuit. FIG. 2 specifically illustrates a silicon layer 20 on an insulator layer 22 on a support 24. An insulator layer 26 is provided on the top surface of the silicon layer 20 and the laser-trimmable material 28 is provided thereon. The selection of the thickness of the insulative layer 22 is selected using the criteria above to be an integer multiple of half the wavelength of the laser light in the insulative layer 22.

It should be noted that although some forms of SOI do not allow placement of the thin film resistor over polysilicon, all resistors must be over silicon and silicon dioxide insulating layer. Thus the present method applies to any laser trimming of a thin film on a semiconductor which in turn is on an optically tuned insulator.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. In an integrated circuit having dielectrically isolated islands on whose surface materials have been applied and laser-trimmed to desired dimensions with laser light from a laser, the improvement comprising the thickness of the layer of dielectric isolation of the islands from each other is approximately an integer multiple of one-half of the wavelength of the laser light in the dielectric isolation so that the layer of dielectric isolation would not reflect said laser light.

2. The integrated circuit according to claim 1 wherein said thickness is within a range of said integer multiple of one-half the wavelength of the laser light in the dielectric isolation plus or minus one-eighth the wavelength of the laser light in the dielectric isolation.

3. In an integrated circuit having a semiconductor layer on whose top surface materials have been applied and laser-trimmed to desired dimensions with laser light from a laser and on whose bottom side is a layer of dielectric material, the improvement comprising the thickness of the layer of dielectric material is approximately an integer multiple of one half of the wavelength of the laser light in the dielectric material so that the layer of dielectric material would not reflect said laser light.

4. The integrated circuit according to claim 3 wherein said thickness is within a range of said integer multiple of one-half the wavelength of the laser light in the dielectric material plus or minus one-eighth the wavelength of the laser light in the dielectric material.

* * * * *